United States Patent [19]

Russell et al.

[11] Patent Number: 5,528,071

[45] Date of Patent: Jun. 18, 1996

[54] P-I-N PHOTODIODE WITH TRANSPARENT CONDUCTOR N+LAYER

[76] Inventors: Jimmie L. Russell, 850 Russell Ave., Apt. S6, Santa Rosa, Calif. 95403; Scott S. Elliott, 552 Caber Dr., Santa Rosa, Calif. 95409; Shih-Yuan Wang, 766 Encina Grande, Palo Alto, Calif. 94306

[21] Appl. No.: 384,488

[22] Filed: Feb. 2, 1995

Related U.S. Application Data

[63] Continuation of Ser. No. 33,065, Mar. 10, 1993, abandoned, which is a continuation of Ser. No. 581,165, Sep. 4, 1990, abandoned, which is a continuation of Ser. No. 467,099, Jan. 18, 1990, abandoned.

[51] Int. Cl.⁶ ............ H01L 27/14; H01L 29/82; H01L 29/84; H01L 31/075
[52] U.S. Cl. ............ 257/458; 257/414; 257/431; 257/432; 257/434; 257/461
[58] Field of Search ............ 357/16, 17, 19, 357/58, 30; 257/414, 431, 432, 434, 435, 458, 459, 461

[56] References Cited

U.S. PATENT DOCUMENTS

| | | | |
|---|---|---|---|
| 4,633,287 | 12/1986 | Yamazaki | 357/16 |
| 4,796,084 | 1/1989 | Kamasaki | 357/19 |
| 4,885,622 | 12/1989 | Uchiyama et al. | 357/58 |

FOREIGN PATENT DOCUMENTS

| | | | |
|---|---|---|---|
| 0215083 | 12/1983 | Japan | 357/16 |

OTHER PUBLICATIONS

David Constantine, Molecular–Beam Epitaxial Growth, and Characterization of Aluminum Gallium Arsenide/Indium Gallium Arsenide Single Quantum–Well Modulation–Doped Field–Effect Transistor Structures, Dissertation Cornell University, p. 235.

Sacks et al., Effects of Hot Sources on Residual Doping in GaAs Grown by Molecular Beam Epitaxy, Appl. Phys. Lett. vol. 52, No. 12, p. 997.

Salmon et al., The Effect of Aluminum Composition on Silicon Donor Behavior in $Al_xGa(1-x)As$, J. Vac. Sci. Technol. B 2 (2), p. 197.

Heiblum et al., Summary Abstract: High Purity GaAs and AlGaAs Grown by MBE, J. Vac. Sci. Technol. B 2 (2), p. 233.

Davies et al., The Growth and Characterization of Nominally Undoped $Al(1-x)InxAs$ Grown by Molecular Beam Epitaxy, J. Vac. Sci. Technol. B 2 (2), p. 219.

*Primary Examiner*—Sara W. Crane
*Assistant Examiner*—Carl Whitehead, Jr.

[57] ABSTRACT

The elimination of the spatial variation in the frequency response of large area p-i-n photodiodes is disclosed using indium tin oxide (ITO) $n^+$ material as a transparent contact overlayer. The I-V, C-V, and frequency response characteristics are shown for p-i-n photodiodes fabricated with and without the $ITOn^+$ contact overlayer to demonstrate the superior performance of the indium-tin-oxide p-i-n photodiode. Also, a p-i-n photodiode can be structured using an $ITOn^+$ window layer to extend the operating range to shorter optical wavelengths, for example, from 1.0 μm down to 0.4 μm.

20 Claims, 11 Drawing Sheets

FIG. 8B

P-I-N PHOTODIODE WITH TRANSPARENT CONDUCTOR N+LAYER

CROSS REFERENCE TO RELATED APPLICATION

This is a continuation of application Ser. No. 08/033,065 filed Mar. 30, 1993, now abandoned, which is a continuation of application Ser. No. 07/581,165 filed on Sep. 4, 1990, now abandoned, which is a continuation of application Ser. No. 07/467,099 filed on Jan. 18, 1990, now abandoned.

BACKGROUND OF THE INVENTION

This invention relates to opto-electronic devices and, more particularly, to a photodetector for converting an optical signal to an electrical signal. Specifically, one embodiment of the invention is directed to a p-i-n photodiode which has a uniform detection characteristic in response to radiation that is distributed across the surface of the photodiode and which can be structured to operate over a broad range of optical wavelengths, such as from 0.4 to 1.6 µm. For example, such a p-i-n photodiode has potential use in photonics instrumentation, such as an optical spectrum analyzer.

InP/InGaAs/InP p-i-n photodiodes and avalanche photodiodes are the typical candidates for optical-fiber communications in the 1.0 to 1.6 µm wavelength range. See, for example, Carey, K. W., Wang, S. Y., Hull, R., Turner, J. E., Oertel, D., Bauer, R., and Bimberg, D., "Characterization of InP/InGaAs/InP Heterostructures Grown by Organometallic Vapor Phase Epitaxy For High-Speed p-i-n Photodiodes," Journal of Crystal Growth, 77, 558–563, (1986), and Moseley, A. J., Urquhart, J., Hodson, P. D., Riffat, J. R., and Davies, J. I., "InGaAs/InP SAGM Avalanche Photodiodes Incorporating a Pseudoquaternary Superlattice Graded Heterojunction Grown by Atmospheric-Pressure MOCVD," Electronics Letters, 23, 914–915, (1987). These p-i-n photodiodes are the present photodetectors-of-choice because of their superior bandwidth. Bowers, J. E., and Burrus, C. A., "InGaAs PIN Photodetectors with Modulation Response To Millimeter Wavelengths," Electronics Letters, 21, 812–814, (1985), and Tucker, R. S., Taylor, A. J., Burrus, C. A., Eisenstein, G., Wiesenfeld, J. M., "Coaxially Mounted 67 GHz Bandwidth InGaAs PIN Photodiode," Electronics Letters, 22, 917–918, (1986). Also, these p-i-n photodiodes are considered superior because of their low dark current characteristic. Ohnaka, K., Kubo, M., and Shibata, J., "A Low Dark Current InGaAs/InP p-i-n Photodiode With Covered Mesa Structure," IEEE Transactions On Electron Devices, ED-34, 199–204, (1987).

Figure 1:
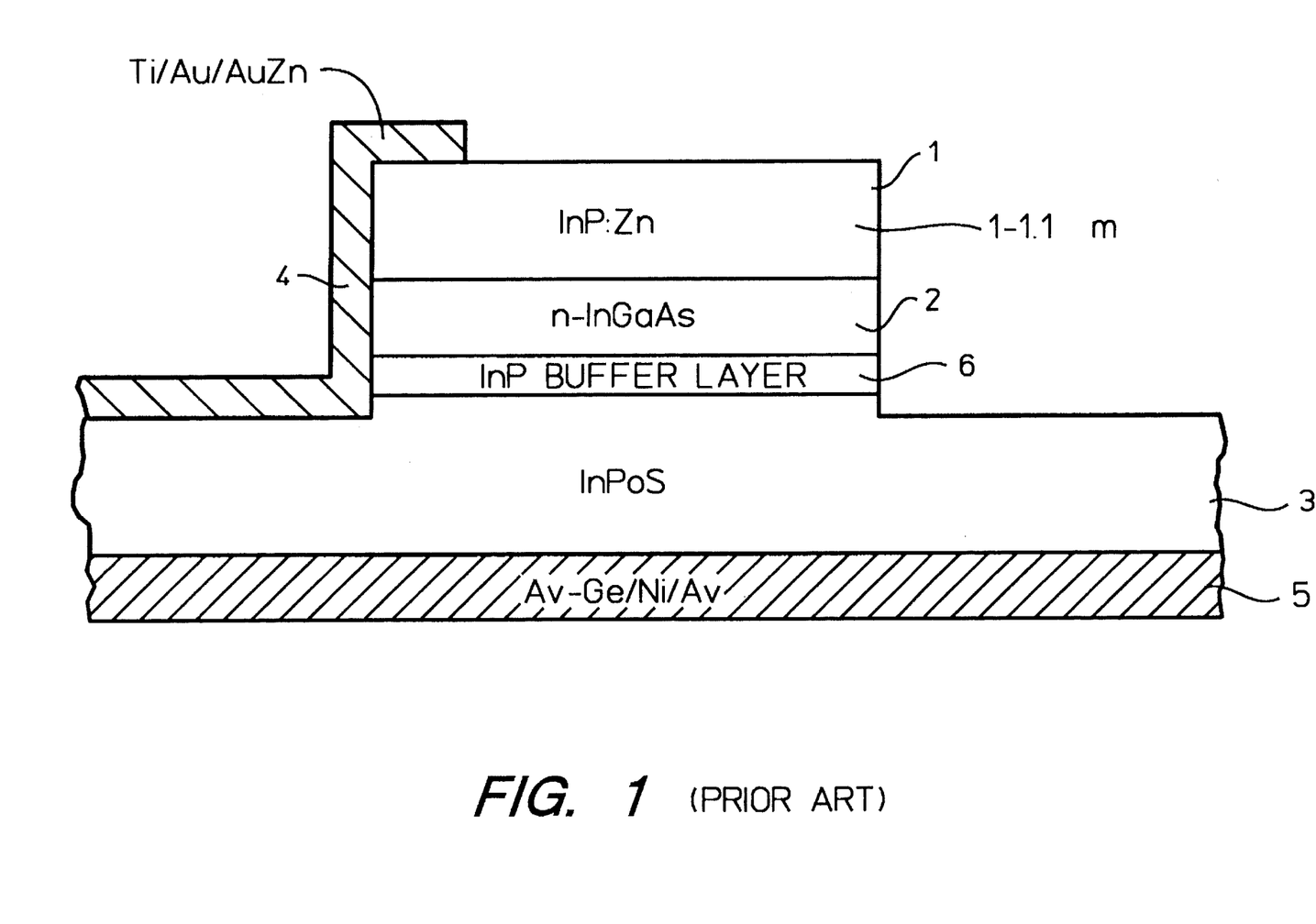
FIG. 1 is a cross-sectional view of a known p-i-n photodiode.

A window layer, that is, the InP top layer in an InP/InGaAs/InP p-i-n photodiode structure, which is typically an InP:Zn p$^+$material, is needed in the structure of these photodiodes in order for them to provide a fast response. If an InGaAs p$^+$layer were substituted for the InP:Zn p$^+$top layer to provide an InGaAs p$^+$/InGaAs n$^-$/InP:S structure, the resulting p-i-n photodiodes would need to rely on the diffusion characteristic of the InGaAs n$^-$material to operate, which would result in an unacceptably slow response. However, the resistance of the InP:Zn p+ layer is not low enough to assure uniform response of the p-i-n photodiode when radiation is distributed across the surface of the entire photodiode. Considered in more detail, the known InP/InGaAs/InP p-i-n photodiode structure is shown in FIG. 1. This p-i-n photodiode typically comprises an InP:Zn/InGaAs/InP:S structure 1,2,3 disposed between top Ti/Au/AuZn/Au and bottom Au-Ge/Ni/Au contacts 4, 5, respectively. As shown in FIG. 1, a buffer layer 6, for example, InP, can be incorporated between the InGaAs n$^-$ and InP:S layers 2 and 3, respectively. The InP:Zn p+ layer is typically on the order of 1.0 to 1.1 µm thick. Unfortunately, the InP:Zn p$^+$layer 1 is thick enough that a relatively long growing time is needed. This causes diffusion of Zn into the InGaAs n$^-$layer 2. Consequently, there is a migration of p dopant from the InP:Zn p+ layer 1 into the InGaAs n$^-$layer 2, that is, the Zn dopes the InGaAs material p$^+$. This means that the p-i-n photodiode begins to act as though the InP:Zn p$^+$ window layer 1 is eliminated. Accordingly, carriers move more slowly in the InGaAs n$^-$layer 2, which is evidenced by the p-i-n photodiode having a slow response.

A single, large area p-i-n photodiode having a fast response could potentially be used to detect light from both single mode and multi-mode optical fibers, which produce spots of different diameters. However, the need to detect light beams of different diameters also mandates not only a fast response, as provided by known p-i-n photodiodes, but also a uniform photodetector response characteristic across the detecting area. Unfortunately, these known InP/InGaAs/InP p-i-n photodiodes do not provide a uniform response.

It is therefore desirable to provide a p-i-n photodiode having a fast response, which also has a uniform photodetector response characteristic across the detecting area. It is also desirable that the p-i-n photodiode operate over a broad range of optical wavelengths.

SUMMARY OF THE INVENTION

One embodiment of the present invention provides a p-i-n photodiode having a fast response which also has a uniform detection characteristic in response to radiation that is distributed across the surface of the photodiode. An InP/InGaAs/InP p-i-n photodiode in accordance with one embodiment of the invention has an improved response uniformity due to the incorporation of a transparent n$^+$layer conductor contact. For example, the use of an overlayer of indium tin oxide (ITO) n$^+$material as a transparent conductor contact improves the frequency response uniformity of an InP/InGaAs/InP p-i-n photodiode. Preferably, in accordance with a further embodiment of the invention, the p-i-n photodiode is structured so that an ITOn$^+$layer is substituted for the top InP layer in an InP/InGaAs/InP p-i-n photodiode to enable detection of a broad range of optical wavelengths, such as from 0.4 to 1.6 µm.

While known p-i-n photodiodes include an InP:Zn p$^+$top layer, which has a resistance that is not low enough to assure uniform device response, the added ITOn$^+$contact overlayer incorporated into the p-i-n photodiode in accordance with one embodiment of the invention provides a relatively low resistance n$^+$layer conductor in parallel with the InP:Zn p$^+$layer to reduce the effective resistance of the window layer. In a further embodiment in accordance with the invention, the ITOn$^+$contact layer is deposited to provide a p-i-n photodiode that has an operating range from 0.4 to 1.6 µm and therefore detects radiation from the visible region through the near infrared. In this further embodiment of the invention, the InP:Zn p$^+$layer replaces the InP:S bottom layer, and the InP:S layer eliminated.

The spatial variation of the frequency response of large area p-i-n photodiodes is therefore eliminated by using ITOn$^+$material as a transparent contact over the entire window layer or as the window layer. This result makes such large area p-i-n photodiodes suitable for use with both single and multi-mode optical fibers.

The use of the transparent conductor n⁺layer in a p-i-n photodiode also provides another advantage over the InP:Zn p+layer of known p-i-n photodiodes. In the known InP/InGaAs/InP structure, the InP top layer establishes the short wavelength end of the visible spectrum as the lower limit for the photodiode. Accordingly, one could previously only detect radiation in the range from 1.0 to 1.6 µm. The advantage of the p-i-n photodiode in accordance with the further embodiment of the invention is that the optical characteristic of transparent ITOn⁺conductor material establishes the short wavelength end of the visible spectrum as the lower limit for the photodiode. Accordingly, the p-i-n photodiode in accordance with the further embodiment of the invention extends the range to encompass optical wavelengths from 0.4 to 1.6 µm.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings. In the drawings:

FIG. 4, comprising FIGS. 4A and 4B, illustrates the frequency response of 80.0 µm diameter p-i-n photodiodes when illuminated at the center of the detecting area and at the edge of the detecting area next to an ohmic contact, in which

FIG. 7, comprising FIG. 8, comprising

DETAILED DESCRIPTION OF THE PREFERRED EMBODIMENTS

Indium tin oxide (ITO) has been previously used in photodiode and other opto-electronic devices. D. G. Parker reported using ITO to make progressively faster Schottky barrier photodiodes in GaAs. Parker, D. G., Say, P. G., Hansom, A. M., and Sibbett, W., "110 GHz High-Efficiency Photodiodes Fabricated From Indium Tin Oxide/GaAs," Electronics Letters, 23, 527–528, (1987); Parker, D. G., and Say, P. G., "Indium Tin Oxide/GaAs Photodiodes For Millimetric-Wave Applications," Electronics Letters, 22, 1266–1267, (1986); and Parker, D. G., "Use of Transparent Indium Tin Oxide to Form a Highly Efficient 20 GHz Schottky Barrier Photodiode," Electronics Letters, 21, 778, (1985). However, the Schottky barrier structure is substantially different from a p-i-n photodiode structure in which ITO is not previously known to have been used.

One embodiment of a p-i-n photodiode in accordance with the invention eliminates the spatial variation in the frequency response of large area p-i-n photodiodes by incorporating an ITOn⁺overlayer as a transparent conductor contact. As will be described later, the I-V, C-V, and frequency response characteristics of p-i-n photodiodes fabricated with and without the ITOn⁺contact overlayer demonstrate the superior performance of the indium-tin-oxide p-i-n photodiode.

Figure 2:
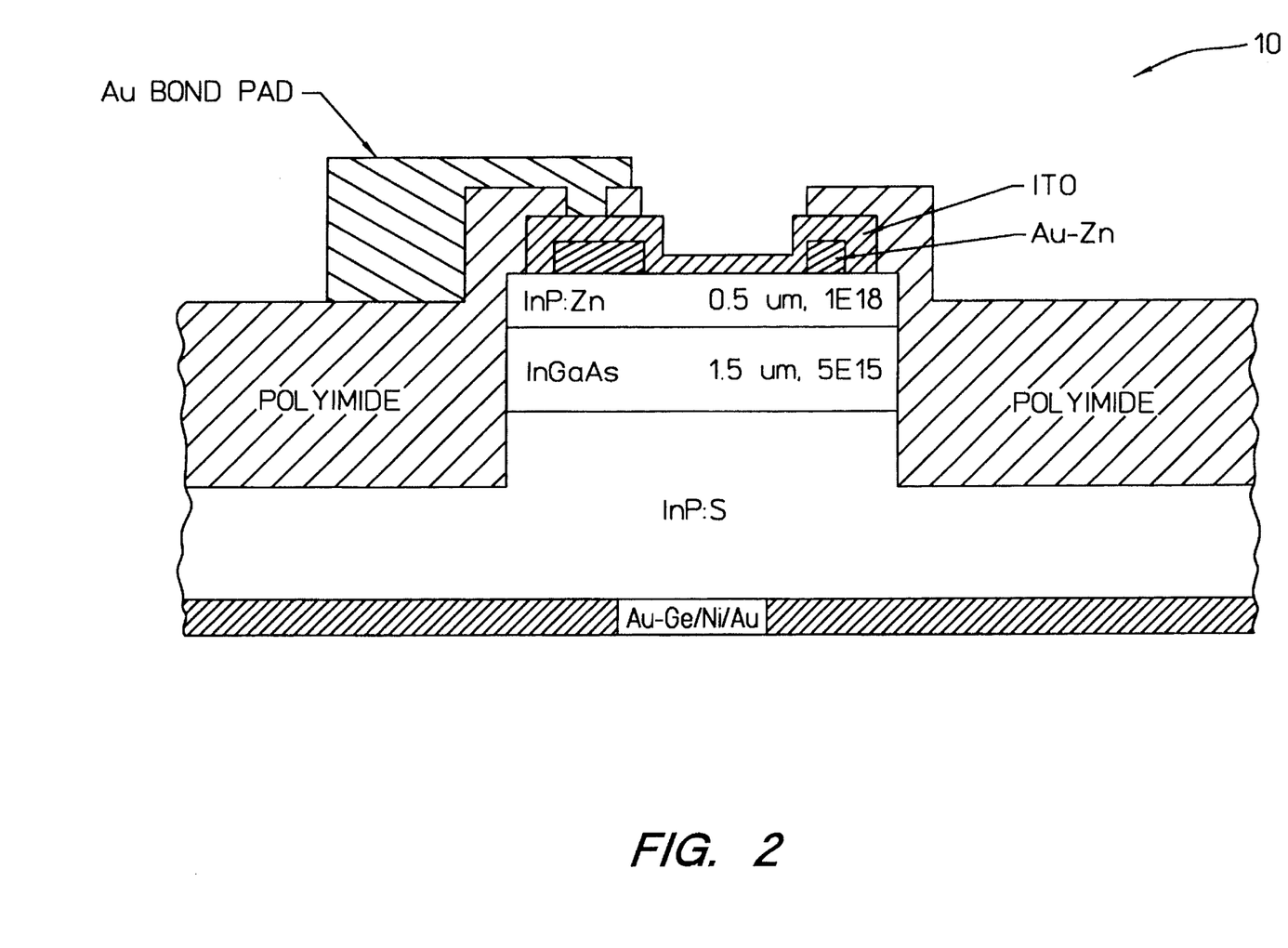
FIG. 2 is a cross-sectional view of a p-i-n photodiode in accordance with one embodiment of the invention comprising an InP/InGaAs/InP p-i-n photodiode using an indium tin oxide (ITO) n⁺material overlayer as a transparent conductor contact.

A front-side illuminated p-i-n photodiode in accordance with one embodiment of the invention, generally designated by the numeral 10, is shown in cross-section in FIG. 2. The p-i-n photodiode 10 comprises a grown InP/InGaAs/InP structure (sandwich).

Referring in more detail to FIG. 2, the p-i-n photodiode 10 comprises an InP:S conducting substrate, a 1.5 µm thick $In_{0.53}Ga_{0.47}As$ unintentionally doped layer, lattice-matched to the substrate, and a 0.5 µm thick InP:Zn p⁺contact layer. The InP:Zn p⁺ layer is a relatively thin layer. In contrast, the InP:Zn p⁺layer is typically on the order of 1.0 to 1.1 µm thick in known p-i-n photodiodes. The $In_{0.53}Ga_{0.47}As$ n⁺layer is the active layer where radiation that impinges on the surface of the p-i-n photodiode 10 is absorbed. The InP:S layer is a relatively thick layer.

An Au-Ge/Ni/Au bottom contact is evaporated onto the InP:S layer included in the structure. Then, Au-Zn top contacts are evaporated onto the InP:Zn p⁺layer.

A suitable photoresist mask is used to mask the top surface of the structure, except where ITO is to be applied. Next, ITO is RF sputter-deposited onto the top surface of the structure. Thereafter, the photoresist is removed.

Next, another suitable photoresist mask is applied to the ITO/contact area, and the mesa is wet-etched. Polyimide is then preferably spun onto the structure. Next, via holes are opened in the polyimide using a further suitable photoresist mask followed by wet-etching.

Finally, an Au bond pad is plated on. During this final processing, an additional suitable photoresist mask is preferably applied to the polyimide where the Au bond pad is to be plated on, and TiAu is deposited on the polyimide to enable the Au to be plated-up. Then, the photoresist mask is removed.

One implementation of the p-i-n photodiode 10 was fabricated as follows. The $In_{0.53}Ga_{0.47}As$ n⁻layer was unintentionally doped 5E15 $cm^{-3}$ n-type, and the InP:Zn p⁺ contact layer was doped approximately 1E18 $cm^{-3}$; the epitaxial layers were grown using atmospheric metallorganic chemical vapor deposition (MOCVD). The n⁺contact metallization was Au-Ge/Ni/Au, and Au-Zn/Au was used for the ring-shaped p⁺contact; the contacts were alloyed at 380° C. and 420° C. respectively The p⁺contact defines the diameter of the detecting area.

Next, a photoresist liftoff mask was processed, leaving exposed the p⁺contact and the detecting area. Using RF-bias sputtering in a reactive environment, 1950 Angstroms of ITO were deposited onto the wafer. The resulting ITO film composition was approximately, by weight, 85% indium oxide and 15% tin oxide with a film resistivity equal to $2.9 \times 10^{-4}$ Ω-cm. Removing the liftoff mask left the ITO covering the detecting area of the p-i-n photodiode 10 and the $p^+$ contact. Conventional wet chemical processing was used to form the mesa. A 3.0 μm thick layer of Dupont 2556 polyimide served as passivation for the mesa and isolated the plated Au bond pad from the substrate.

Figure 3:
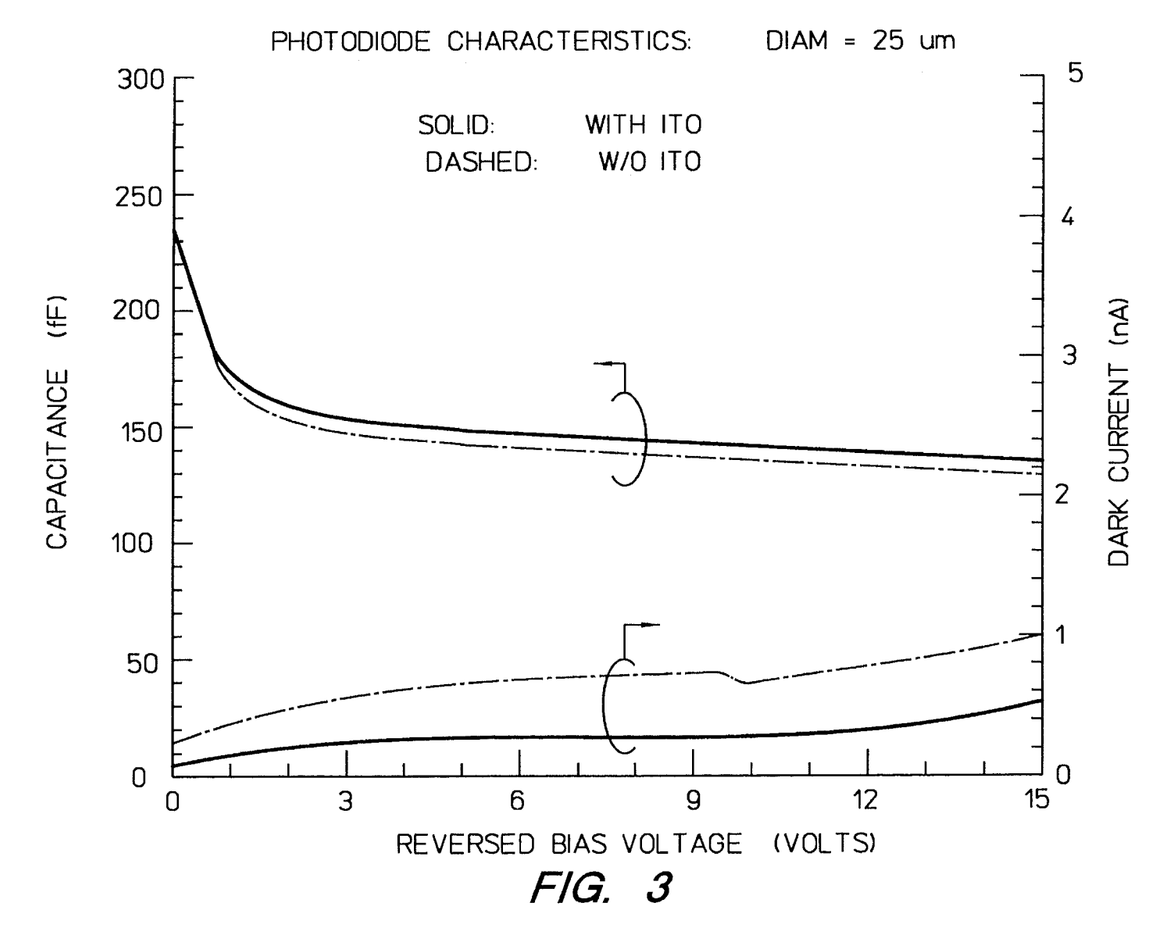
FIG. 3 illustrates typical I-V and C-V characteristics for a known p-i-n photodiode and for the p-i-n photodiode shown in FIG. 2 having an ITO n⁺conductor material overlayer.

Typical I-V and C-V characteristics of p-i-n photodiodes with and without an ITO$n^+$conductor material layer with 25.0 μm diameter for the detecting area are shown in FIG. 3. The corresponding current density for these devices is approximately 5.0 μA/cm$^2$.

For frequency response measurements, the p-i-n photodiodes with and without an ITO$n^+$conductor material layer were attached to a coplanar test circuit with conductive epoxy. The photodiode active area was illuminated with the output of a 1.3 μm continuous wave (CW) laser diode modulated by a Mach-Zender interferometer optical modulator and microwave synthesizer. The frequency of modulation was from 1.0 to 26.5 GHz. Radiation was introduced to the p-i-n photodiodes using optical fibers and a modified Leitz Laborlux 12 HL microscope creating a final spot size of approximately 10.0 μm diameter.

The electrical response of the combined modulator and p-i-n photodiodes were measured with a Hewlett-Packard Company HP 8510 microwave network analyzer. For absolute measurements of the p-i-n photodiodes alone, the optical modulator would have to be calibrated separately, and its frequency response subtracted from the overall frequency response. However, absolute accuracy was not necessary for a relative measurement, where a comparison of the frequency response of the p-i-n photodiodes when illuminated in the center of the active area to the response of the photodiodes when illuminated near an edge is desired. For this measurement, a "response" calibration was made with an uncalibrated high-speed reference p-i-n photodiode, providing an approximate calibration of the system.

Figure 4A:
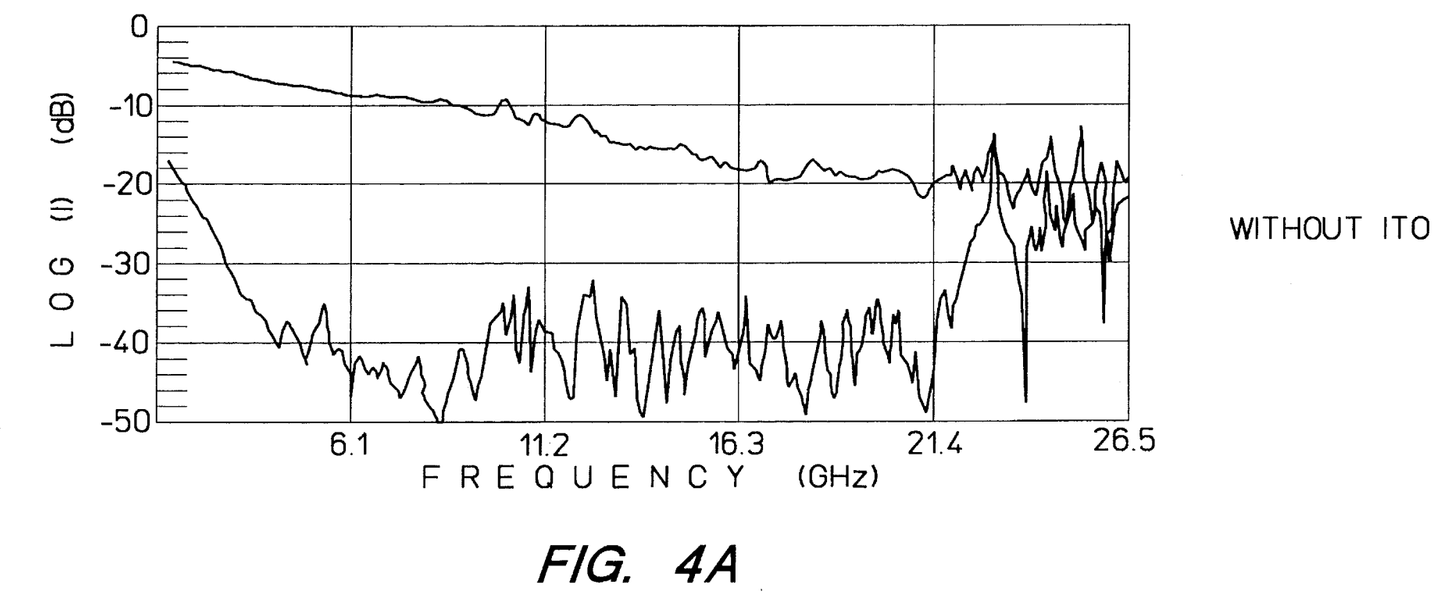
FIG. 4A is the response of a known p-i-n photodiode that does not have an ITOn⁺conductor material overlayer.
Figure 4B:
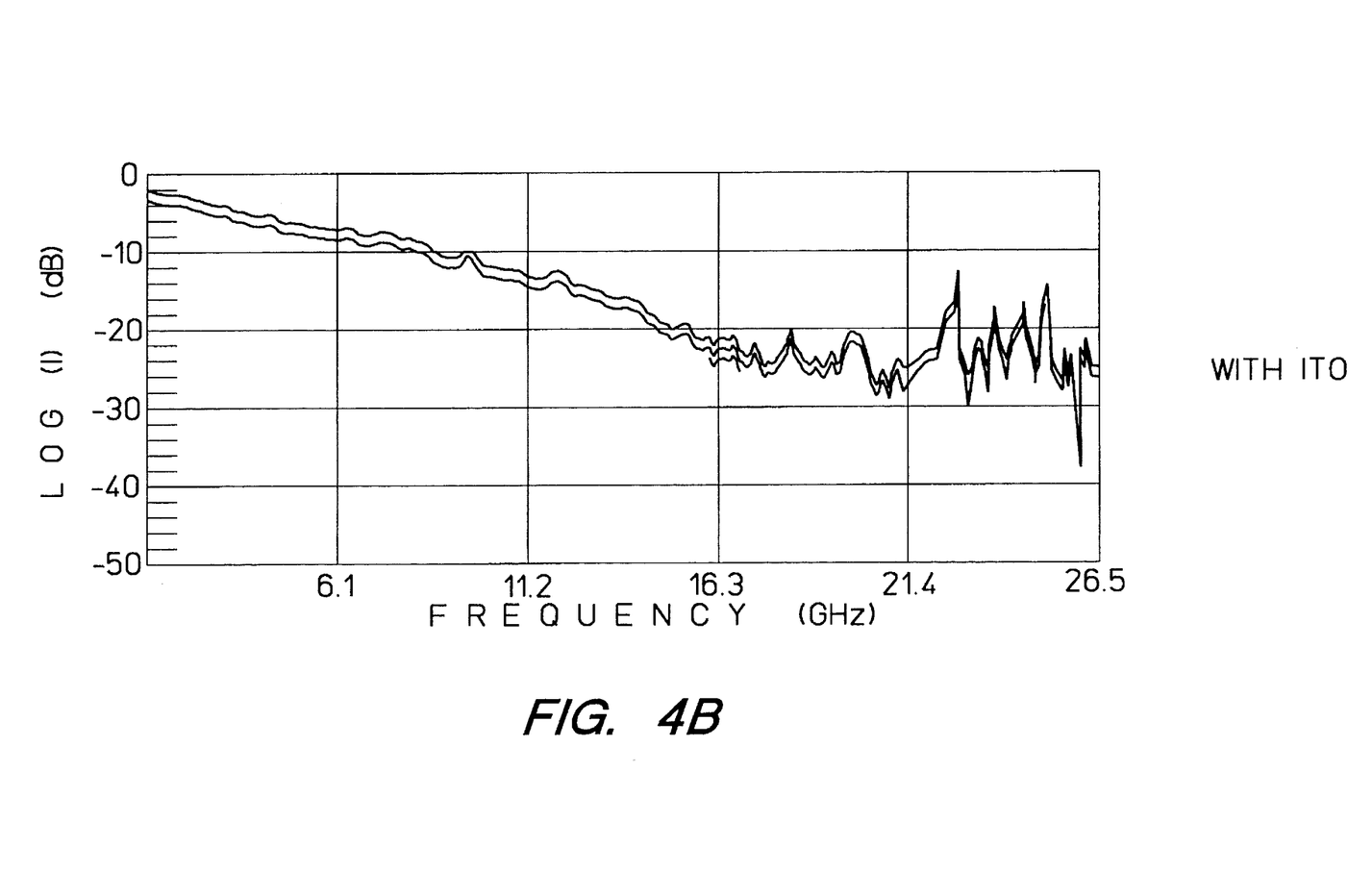
FIG. 4B is the response of the p-i-n photodiode shown in FIG. 2 having an ITO n⁺conductor material overlayer.

The results of the frequency response measurements for 80.0 μm diameter p-i-n photodiodes at 4.5 volts reverse bias are shown in FIG. 4. While the measurements illustrated in FIG. 4 extend to 26.5 GHz, the data are only valid to about 20 GHz due to degradation of signal-to-noise above this frequency. For p-i-n photodiodes with no ITO covering the detecting area, there is a significant difference between the frequency response for illumination at the center of the active area and for illumination at the edge. The center response is worse because the carriers created there are the farthest from the ohmic contacts. Generally, the photodetector bandwidth decreased the farther away from the ohmic contacts that the radiation illuminated the p-i-n photodiode. This accords with Degani, J., Wilt, D. P., and Besomi, P., "Effect of Photocarrier Spreading on the Photoluminescence of Double Heterostructure Material," Journal Of Applied Physics, 56, 468–476, (1984). There was no difference between the center and edge responses for p-i-n photodiodes having the ITO$n^+$conductor material overlayer.

The advantages of the p-i-n photodiode 10 are that the frequency response of the photodiode is now uniform across the entire detecting area and there is no longer a need for a thick $p^+$layer to reduce the resistivity of the $p^+$layer, thereby reducing the growth time of the material layers. Additionally, the use of the ITO transparent conductor contact potentially removes the need for a separate anti-reflection coating.

In accordance with a further embodiment of the invention, a p-i-n photodiode is structured to have a broad operating range, such as from 0.4 to 1.6 μm. As described above, the $p^+$layer resistance is reduced on an InP/InGaAs/InP p-i-n photodiode by the use of an ITO$n^+$contact overlayer. This allows a contact layer that is not a material that absorbs radiation at these optical wavelengths.

It is apparent that the ITO$n^+$contact layer also provides a portion of the window layer with the retained InP:Zn $p^+$material in the structure shown in FIG. 2. Therefore, in the InP/InGaAs/InP material structure, the InP establishes the short wavelength end of the visible spectrum as the lower limit for the p-i-n photodiode, which can only detect radiation in the range from 1.0 to 1.6 μm.

In accordance a further embodiment of the invention, an ITO$n^+$layer is deposited to provide a p-i-n photodiode that has an operating range from 0.4 to 1.6 μm and therefore detects radiation from the visible region through the near infrared, since ITO is transparent at these optical wavelengths. Additionally, the InP:Zn $p^+$layer is substituted for the InP:S layer. Accordingly, an inverted structure results, as shown in FIG. 5.

Figure 5:
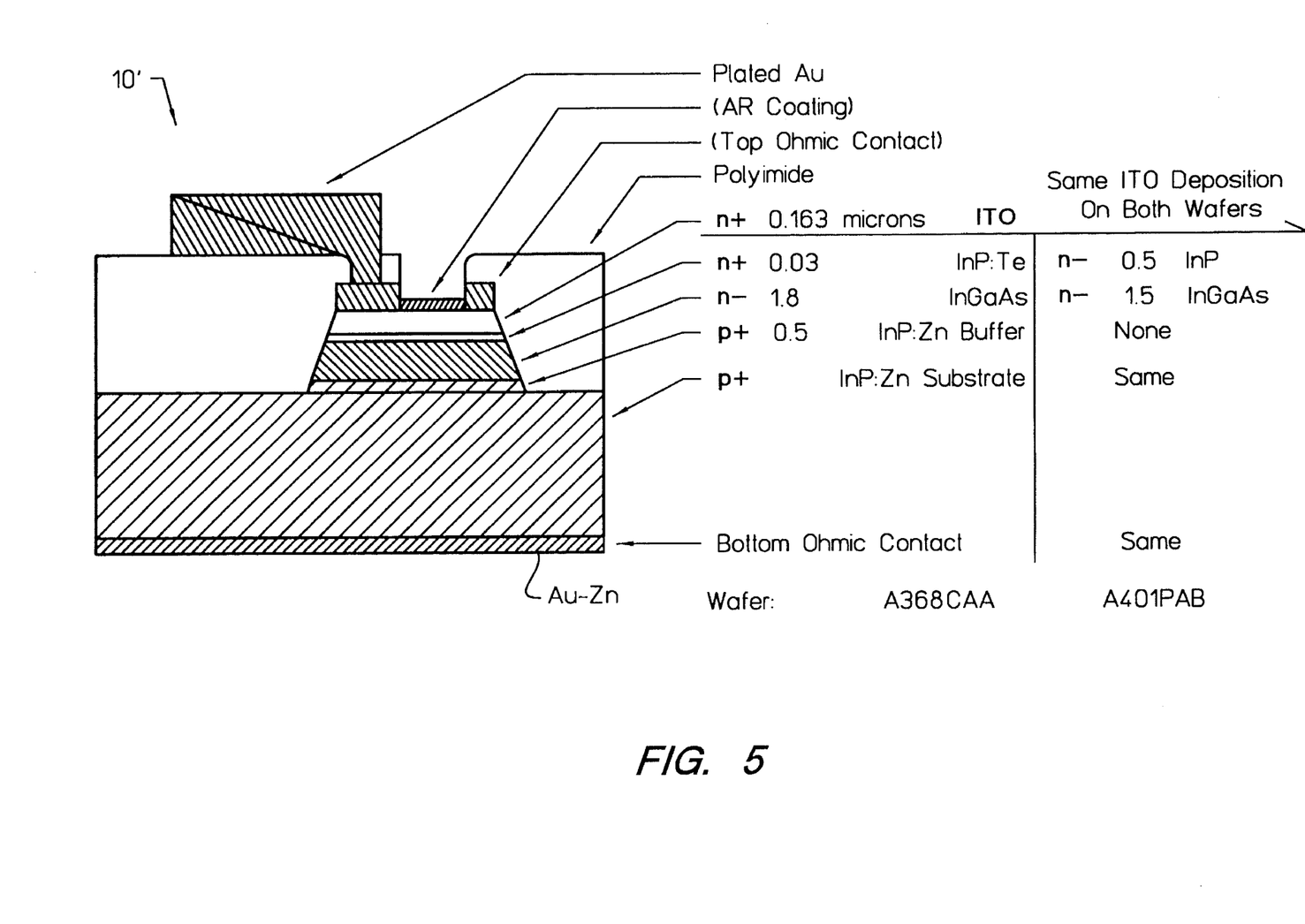
FIG. 5 is a cross-sectional view of a p-i-n photodiode in accordance with a further embodiment of the invention comprising an InGaAs/InP p-i-n photodiode using indium tin oxide (ITO) n⁺material as the window layer.

Referring in more detail to FIG. 5, a p-i-n photodiode 10' comprises a grown InGaAs/InP structure (laminate). The p-i-n photodiode 10' comprises an InP:Zn $p^+$conducting substrate, a 1.8 μm thick $In_{0.53}Ga_{0.47}As$ unintentionally doped, layer, lattice-matched to the substrate, and a 0.163 μm thick ITO$n^+$window layer. The $In_{0.53}Ga_{0.47}As$ $n^+$layer is the active layer where radiation that impinges on the surface of the p-i-n photodiode 10' is absorbed. The InP:Zn $p^+$layer is a relatively thick layer.

As shown in FIG. 5, a 0.5 μm thick InP:Zn $p^+$buffer layer is preferably grown between the InP:Zn $p^+$conducting substrate and the $In_{0.53}Ga_{0.74}As$ $n^-$layer. Also, a 0.03 μm thick InP:Te $n^+$material layer is preferably grown on the $In_{0.53}Ga_{0.47}As$ $n^-$layer to prevent oxidation of the InGaAs material while the laminate structure is transferred to the semiconductor processing station where the ITO $n^+$material is deposited.

An Au-Zn bottom contact is evaporated onto the InP:Zn $p^+$layer included in the structure. A suitable photoresist mask is then used to mask the top surface of the structure, except where ITO is to be applied. Next, ITO is RF sputter-deposited onto the top surface of the structure. Thereafter, the photoresist is removed. Next, another suitable photoresist mask is applied to the ITO/contact area, and the mesa is wet-etched. Polyimide is then preferably spun onto the structure. Next, via holes are opened in the polyimide using a further suitable photoresist mask followed by wet-etching.

Finally, an Au bond pad is plated on. During this final processing, an additional suitable photoresist mask is preferably applied to the polyimide where the Au bond pad is to be plated on, and TiAu is deposited on the polyimide to enable the Au to be plated-up. Then, the photoresist mask is removed.

As shown in FIG. 5, Au-Zn top contacts can be evaporated onto the InP:Zn $p^+$layer before polyimide is applied to the structure. Also, an antireflection coating can be applied to the exposed ITO$n^+$window layer.

In an alternative embodiment of the p-i-n photodiode 10' the InGaAs layer is a 15 μm thick $In_{0.53}Ga_{0.47}As$ layer Also, a 0.5 μm thick unintentionally doped InP layer is substituted for the InP:Te $n^+$layer. Finally, the InP:Zn $p^+$buffer layer is eliminated.

Figure 6A:
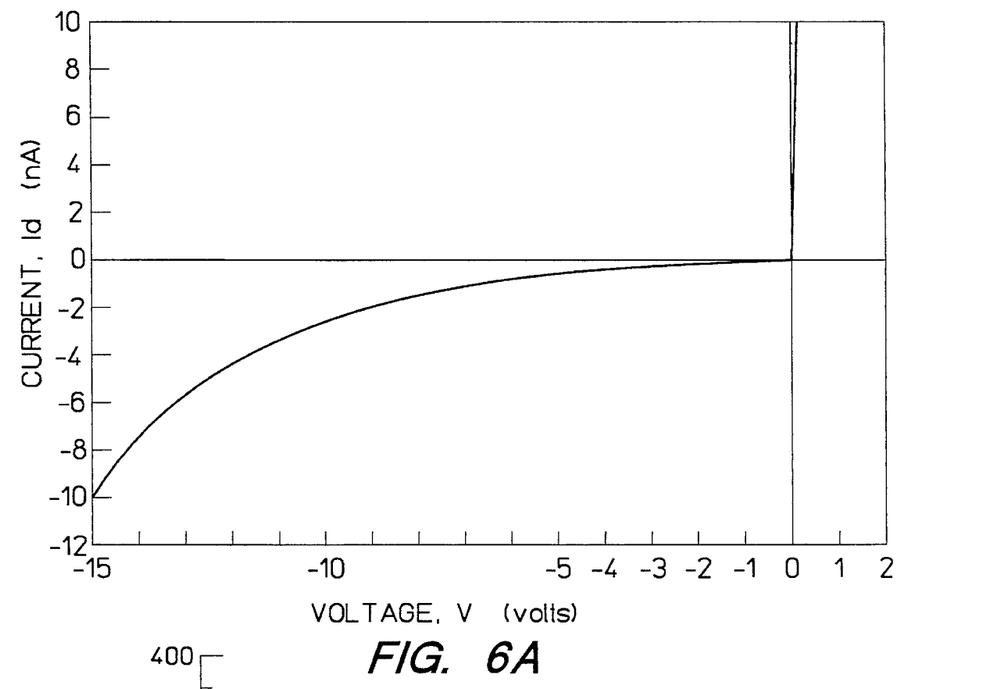
FIG. 6 illustrates a plot of representative data on the dark current of the p-i-n photodiode shown in FIG. 5 measured after a mesa etching step.
Figure 6B:
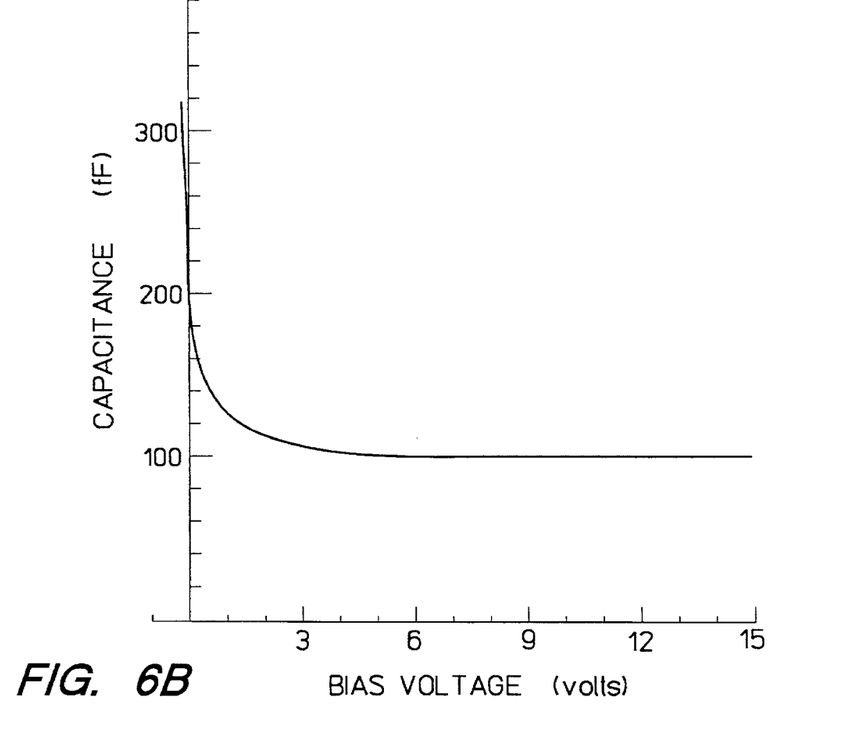

Representative data on the dark current of p-i-n photodiodes having the structure shown in FIG. 5 are shown in FIG. 6. These data were measured after the mesa etching step. The magnitude of the dark current is comparable to that of known InP/InGaAs/InP p-i-n photodiodes at this process step.

Measured responsivity data for extended wavelength p-i-n photodiodes 10' that have been fabricated are shown in Tables I and II below. Table I shows the responsivity for the p-i-n photodiode 10' shown in FIG. 5. Table II shows the responsivity for the alternative embodiment of the p-i-n photodiode 10' described above. The responsivity at an optical wavelength of 0.85 µm is vastly improved over that of a known InP/InGaAs/InP p-i-n photodiode, while maintaining acceptable responsivity at the other wavelengths of interest.

TABLE I

RESPONSIVITY MEASUREMENTS ON WAFER A401PAB
EXTENDED WAVELENGTH DEVICE STRUCTURE
WITH InP/InGaAs ACTIVE REGION
PD25 Devices Probed As Chips In Au Trays

| Device/Calibration | 0.0 V | 0.5 V | 5.0 V | 10.0 V | 0.0 V | 0.5 V | 5.0 V | 10.0 V |
|---|---|---|---|---|---|---|---|---|
| 2B/3 | 0.14 | 0.15 | 0.17 | 0.18 | 0.50 | 0.52 | 0.55 | 0.55 |
| 2C/3 | 0.16 | 0.18 | 0.20 | 0.20 | 0.51 | 0.54 | 0.56 | 0.56 |
| 2D/3 | 0.13 | 0.15 | 0.16 | 0.17 | 0.51 | 0.53 | 0.56 | 0.56 |
| 2E/4 | 0.14 | 0.16 | 0.18 | 0.18 | 0.50 | 0.53 | 0.56 | 0.56 |
| 3A/4 | 0.16 | 0.17 | 0.20 | 0.20 | 0.50 | 0.53 | 0.56 | 0.56 |
| 3B/4 | 0.16 | 0.18 | 0.20 | 0.20 | 0.52 | 0.54 | 0.56 | 0.57 |
| 3D/4 | 0.13 | 0.17 | 0.19 | 0.20 | 0.50 | 0.53 | 0.55 | 0.56 |
| 3E/4 | 0.15 | 0.16 | 0.18 | 0.18 | 0.50 | 0.52 | 0.55 | 0.56 |
| 5A/15 | 0.11 | 0.13 | 0.15 | 0.15 | 0.49 | 0.52 | 0.55 | 0.56 |
| 5B/15 | 0.14 | 0.15 | 0.17 | 0.17 | 0.50 | 0.52 | 0.55 | 0.55 |
| 5C/15 | 0.14 | 0.16 | 0.18 | 0.18 | 0.51 | 0.53 | 0.56 | 0.57 |
| 5D/15 | 0.13 | 0.14 | 0.16 | 0.16 | 0.52 | 0.54 | 0.56 | 0.57 |
| Mean | 0.14 | 0.16 | 0.18 | 0.18 | 0.51 | 0.53 | 0.56 | 0.56 |
| Stan. Dev. | ±0.02 | ±0.02 | ±0.02 | ±0.02 | ±0.01 | ±0.01 | ±0.01 | ±0.01 |
| Theoretical Max | 0.51 | | | | 0.69 | | | |
| | $\lambda = 1.3$ µm | | | | $\lambda = 1.55$ µm | | | |
| 2B/2 | 0.74 | 0.75 | 0.75 | 0.76 | 0.46 | 0.46 | 0.47 | 0.48 |
| 2C/2 | 0.69 | 0.70 | 0.70 | 0.70 | 0.45 | 0.46 | 0.46 | 0.47 |
| 2D/3 | 0.61 | 0.62 | 0.62 | 0.62 | 0.38 | 0.39 | 0.40 | 0.40 |
| 2E/3 | 0.58 | 0.60 | 0.60 | 0.60 | 0.37 | 0.37 | 0.38 | 0.38 |
| 3A/3 | 0.63 | 0.65 | 0.65 | 0.65 | 0.41 | 0.42 | 0.42 | 0.43 |
| 3B/3 | 0.61 | 0.67 | 0.67 | 0.67 | 0.41 | 0.42 | 0.42 | 0.44 |
| 3D/3 | 0.63 | 0.65 | 0.65 | 0.65 | 0.39 | 0.40 | 0.40 | 0.41 |
| 3E/3 | 0.63 | 0.65 | 0.65 | 0.65 | 0.41 | 0.42 | 0.42 | 0.43 |
| 5A/4 | 0.63 | 0.63 | 0.63 | 0.63 | 0.42 | 0.42 | 0.43 | 0.43 |
| 5B/4 | 0.56 | 0.61 | 0.62 | 0.62 | 0.40 | 0.42 | 0.43 | 0.43 |
| 5C/4 | 0.63 | 0.63 | 0.63 | 0.63 | 0.42 | 0.42 | 0.43 | 0.43 |
| 5D/4 | 0.61 | 0.61 | 0.61 | 0.61 | 0.41 | 0.41 | 0.42 | 0.41 |
| Mean | 0.63 | 0.65 | 0.65 | 0.65 | 0.41 | 0.42 | 0.42 | 0.43 |
| Stan. Dev. | ±0.05 | ±0.04 | ±0.04 | ±0.04 | ±0.03 | ±0.03 | ±0.02 | ±0.03 |
| Theoretical Max. | 1.05 | | | | 1.25 | | | |

[1] Optical input power was calibrated at 2.2 µW for this wavelength for all of the devices; source was unstable.
[2] Optical input power was calibrated at 46.2 µW for this wavelength for all of the devices.
[3] Optical input power was calibrated at 2.04 µW for $\lambda = 1.3$ µm and 1.14 µW for $\lambda = 1.55$ µm for this device.
[4] Optical input power was calibrated at 2.35 µW for $\lambda = 1.3$ µm and 1.31 µW for $\lambda = 1.55$ µm for this device.
[5] Optical input power was calibrated at 3.23 µW for $\lambda = 1.3$ µm and 1.67 µW for $\lambda = 1.55$ µm for this device.

TABLE II

RESPONSIVITY MEASUREMENTS ON WAFER A368CAA
EXTENDED WAVELENGTH DEVICE STRUCTURE
PD25 Devices Probed As Chips In Au Trays

| Device | 0.0 V | 0.5 V | 5.0 V | 10.0 V | 0.0 V | 0.5 V | 5.0 V | 10.0 V |
|---|---|---|---|---|---|---|---|---|
| | $\lambda = 0.633$ µm[1] | | | | $\lambda = 0.85$ µm[2] | | | |
| 1A | 0.19 | 0.18 | 0.19 | 0.19 | 0.62 | 0.62 | 0.63 | 0.64 |
| 1B | 0.20 | 0.21 | 0.21 | 0.22 | 0.63 | 0.63 | 0.63 | 0.64 |
| 1C | 0.18 | 0.19 | 0.20 | 0.21 | 0.63 | 0.64 | 0.64 | 0.65 |

TABLE II-continued

RESPONSIVITY MEASUREMENTS ON WAFER A368CAA
EXTENDED WAVELENGTH DEVICE STRUCTURE
PD25 Devices Probed As Chips In Au Trays

| Device | 0.0 V | 0.5 V | 5.0 V | 10.0 V | 0.0 V | 0.5 V | 5.0 V | 10.0 V |
|---|---|---|---|---|---|---|---|---|
| 1D | 0.22 | 0.22 | 0.22 | 0.22 | 0.62 | 0.62 | 0.63 | 0.63 |
| 1E | 0.21 | 0.22 | 0.22 | 0.22 | 0.61 | 0.61 | 0.62 | 0.62 |
| 2A | 0.19 | 0.20 | 0.21 | 0.21 | 0.62 | 0.62 | 0.62 | 0.63 |
| 2B | 0.20 | 0.20 | 0.21 | 0.21 | 0.63 | 0.63 | 0.63 | 0.64 |
| 2C | 0.22 | 0.22 | 0.22 | 0.23 | 0.63 | 0.64 | 0.64 | 0.65 |
| 2D | 0.25 | 0.25 | 0.25 | 0.26 | 0.63 | 0.63 | 0.63 | 0.64 |
| 2E | 0.21 | 0.21 | 0.21 | 0.21 | 0.60 | 0.60 | 0.60 | 0.61 |
| Mean | 0.21 | 0.21 | 0.21 | 0.22 | 0.62 | 0.62 | 0.63 | 0.64 |
| Stan. Dev. | ±0.02 | ±0.02 | ±0.02 | ±0.02 | ±0.01 | ±0.01 | ±0.01 | ±0.01 |
| Theoretical Max | 0.51 | | | | 0.69 | | | |
| | $\lambda = 1.3\ \mu m^3$ | | | | $\lambda = 1.55\ \mu m^4$ | | | |
| 1A | 0.63 | 0.64 | 0.64 | 0.64 | 0.52 | 0.52 | 0.52 | 0.53 |
| 1B | 0.66 | 0.66 | 0.66 | 0.66 | 0.53 | 0.53 | 0.53 | 0.54 |
| 1C | 0.66 | 0.66 | 0.66 | 0.67 | 0.55 | 0.55 | 0.55 | 0.56 |
| 1D | 0.65 | 0.68 | 0.68 | 0.68 | 0.55 | 0.56 | 0.56 | 0.57 |
| 1E | 0.61 | 0.60 | 0.61 | 0.61 | 0.51 | 0.51 | 0.51 | 0.52 |
| 2A | 0.64 | 0.64 | 0.64 | 0.64 | 0.54 | 0.54 | 0.54 | 0.55 |
| 2B | 0.60 | 0.60 | 0.60 | 0.61 | 0.51 | 0.51 | 0.51 | 0.52 |
| 2C | 0.64 | 0.64 | 0.64 | 0.64 | 0.55 | 0.55 | 0.55 | 0.56 |
| 2D | 0.63 | 0.63 | 0.63 | 0.64 | 0.52 | 0.52 | 0.53 | 0.53 |
| 2E | 0.59 | 0.60 | 0.60 | 0.60 | 0.50 | 0.50 | 0.50 | 0.51 |
| Mean | 0.63 | 0.64 | 0.64 | 0.64 | 0.53 | 0.53 | 0.53 | 0.54 |
| Stan. Dev. | ±0.02 | ±0.03 | ±0.03 | ±0.03 | ±0.02 | ±0.02 | ±0.02 | ±0.02 |
| Theoretical Max | 1.05 | | | | 1.25 | | | |

[1]Optical input power was calibrated at 1.726 μW for this wavelength; source was unstable.
[2]Optical input power was calibrated at 42.4 μW for this wavelength.
[3]Optical input power was calibrated at 3.57 μW for this wavelength.
[4]Optical input power was calibrated at 1.78 μW for this wavelength.

Figure 7A:
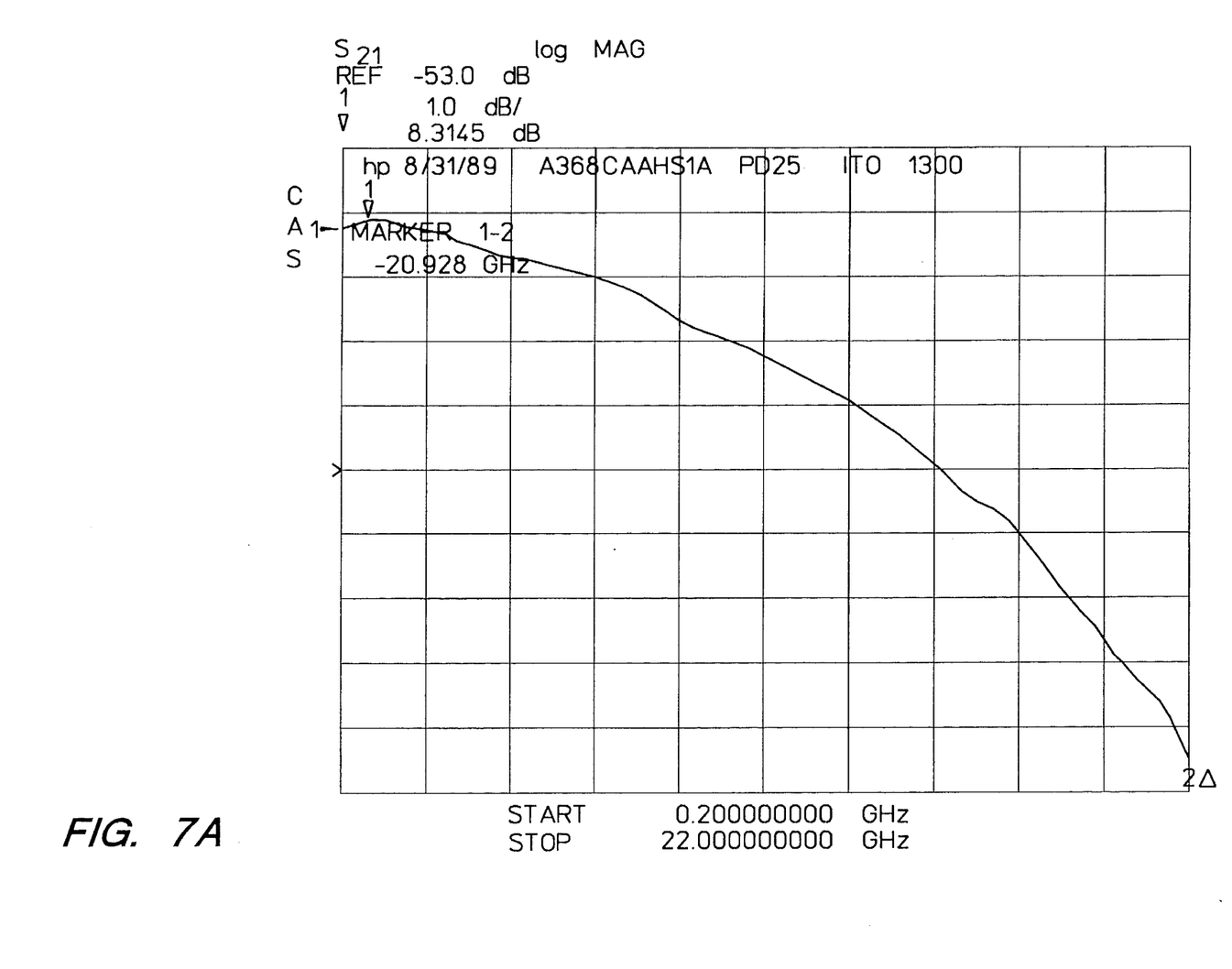
FIGS. 7A and 7B, illustrates frequency response measurements for the p-i-n photodiode shown in FIG. 5 for modulated 1300 nm and 1550 nm optical sources, respectively.
Figure 7B:
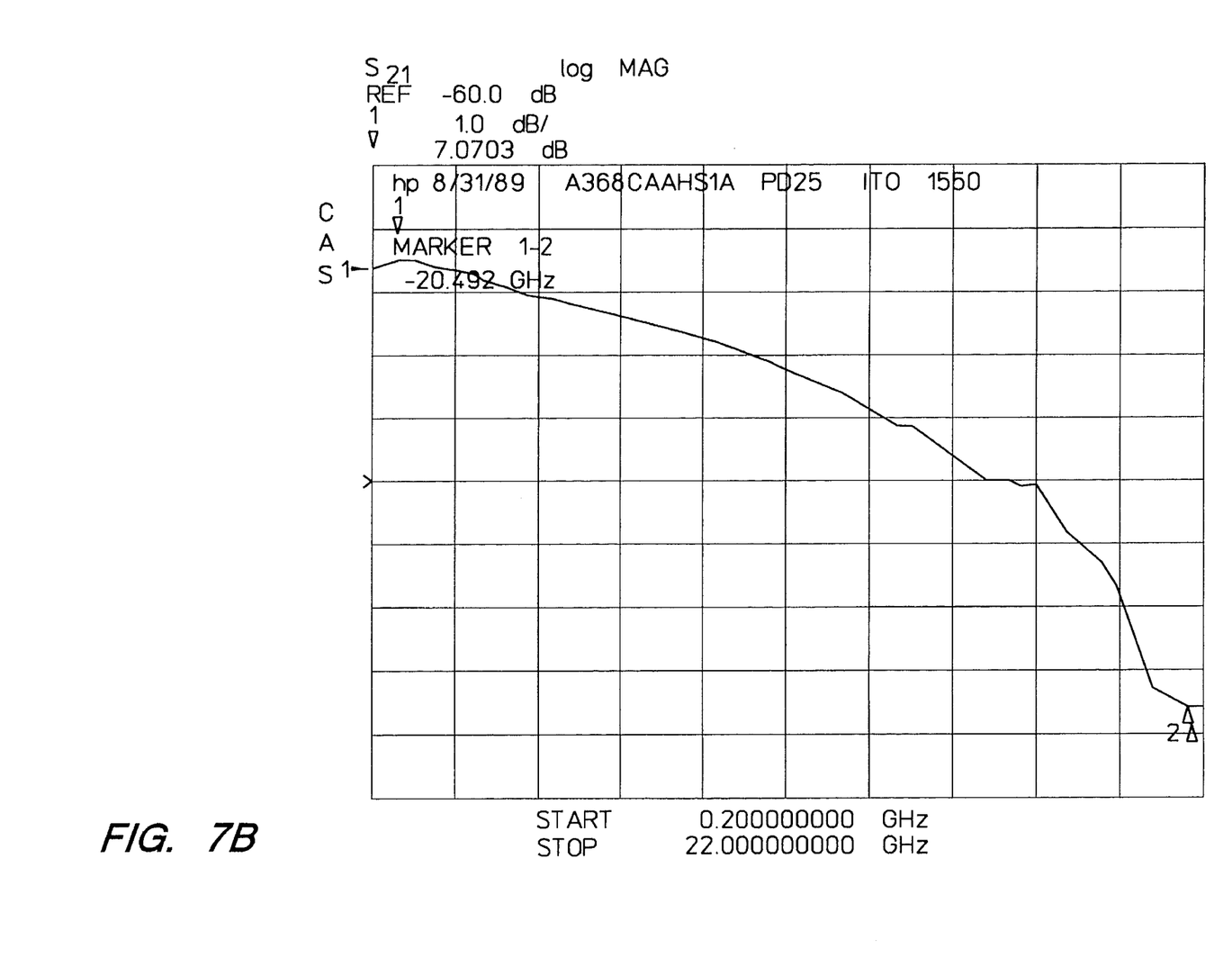
Figure 8A:
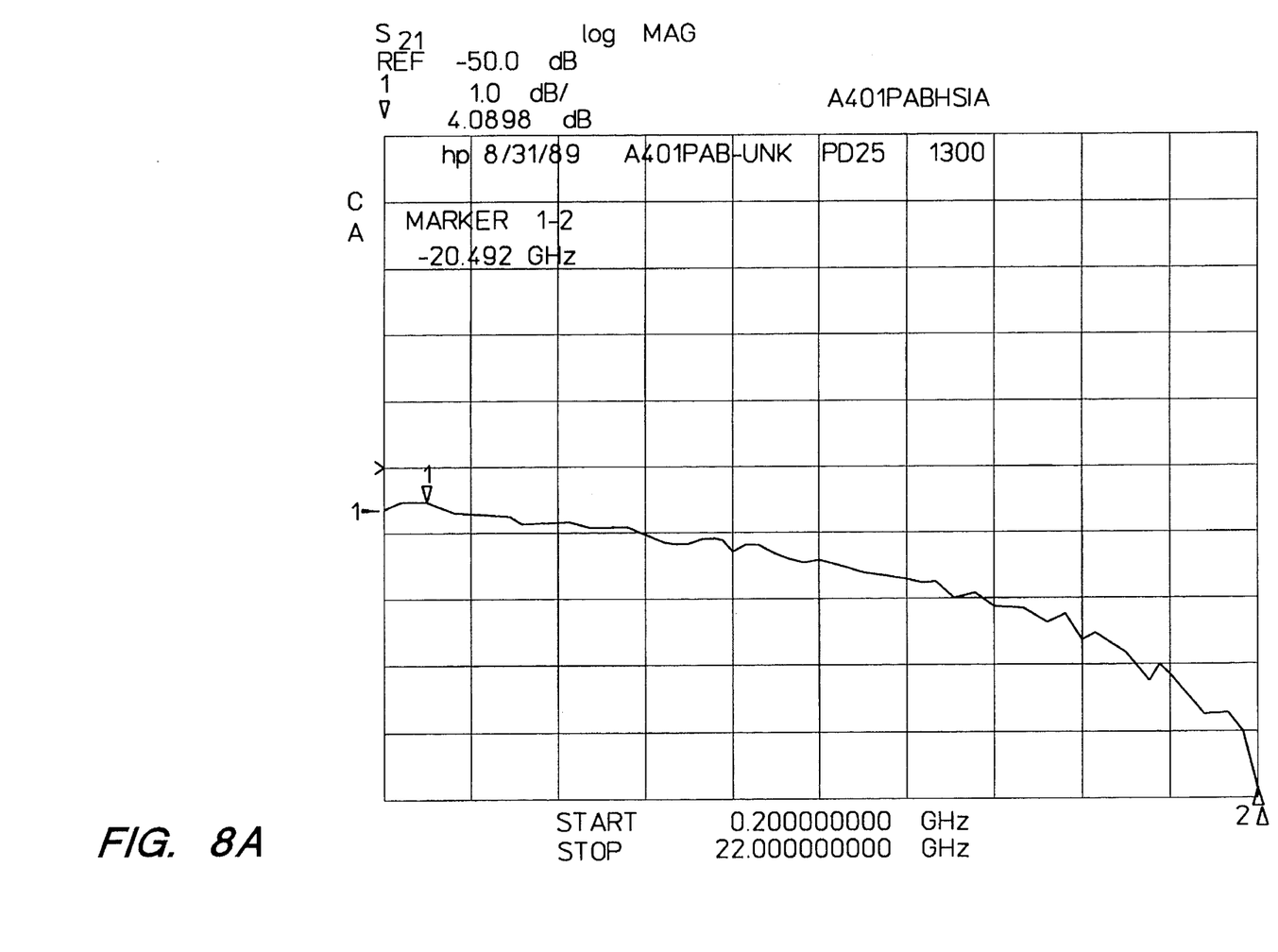
FIGS. 8A and 8B, illustrates frequency response measurements for an alternative embodiment of the p-i-n photodiode shown in FIG. 5 for modulated 1300 nm and 1550 nm optical sources, respectively.
Figure 8B:
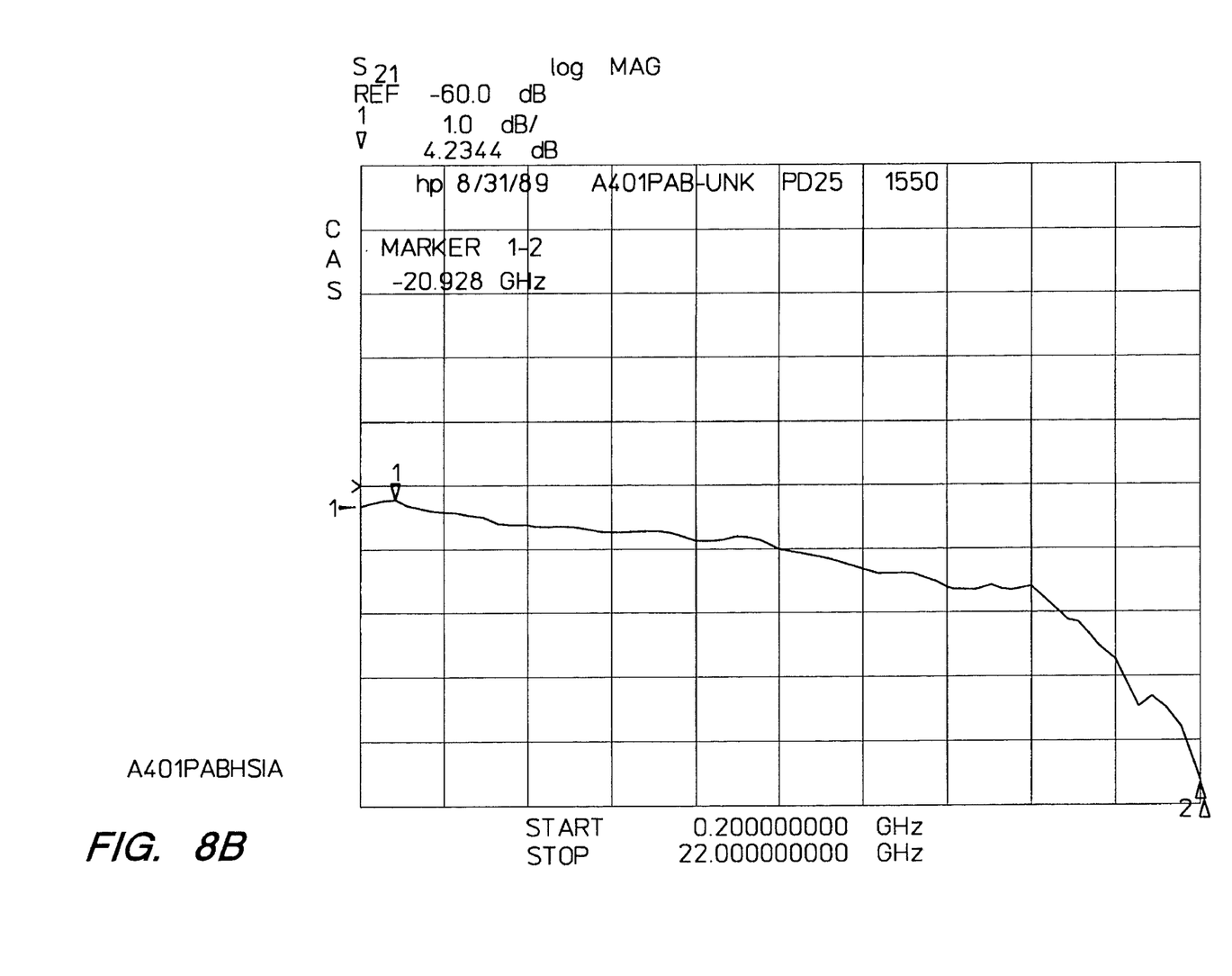

Also, frequency response measurements for the p-i-n photodiode 10' shown in FIG. 5 for modulated 1300 nm and 1550 nm optical sources appear in FIGS. 7A and 7B, respectively. Similarly, frequency response measurements for the alternative embodiment of the p-i-n photodiode 10' described above for modulated 1300 nm and 1550 nm optical sources appear in FIGS. 8A and 8B, respectively.

The foregoing description is offered primarily for purposes of illustration. While a variety of embodiments has been disclosed, it will be readily apparent to those skilled in the art that numerous other modifications and variations not mentioned above can still be made without departing from the spirit and scope of the invention as claimed below.

What is claimed is:

1. In an InP/InGaAs/InP p-i-n photodiode, in which a top InP layer forms a window layer, the improvement comprising:

an InGaAs unintentionally doped layer having a first surface and a second surface and having a thickness of about 1.5 μm;

a top InP layer having a first surface opposite the first surface of the InGaAs layer and a second surface, the top InP layer being relatively thin compared to the thickness of the InGaAs layer;

an InP conducting substrate having a surface opposite the second surface of the InGaAs layer, the InP conducting substrate being relatively thick compared to the thickness of the InGaAs layer; and a transparent conductor contact layer incorporated into the p-i-n photodiode, the transparent conductor contact layer having a surface opposite the second surface of the top InP layer to provide a relatively low resistance layer conductor in parallel with the top InP layer to reduce the effective resistance of the window layer;

whereby the p-i-n photodiode has a fast response and also has a uniform detection characteristic in response to radiation that is distributed across the surface of the photodiode.

2. The p-i-n photodiode of claim 1 wherein the transparent conductor contact layer is an indium tin oxide (ITO) $n^+$ material.

3. The p-i-n photodiode of claim 2 wherein the p-i-n photodiode is a grown InP/InGaAs/InP structure, comprising:

a relatively thick InP:S conducting substrate;

an $In_{0.53}Ga_{0.74}As$ unintentionally doped layer lattice-matched to the InP:S conducting substrate, which functions as an active layer where radiation that impinges on a surface of the p-i-n photodiode is absorbed;

relatively thin top InP:Zn $p^+$ layer;

a bottom contact in contact with the InP:S conducting substrate; and a bond pad is contact with the transparent ITO $n^+$ material conductor contact layer.

4. An InP/InGaAs/InP p-i-n photodiode having a fast response which also has a uniform detection characteristic in response to radiation that is distributed across a surface of the photodiode, comprising:

an InP:S conducting substrate;

an InGaAs unintentionally doped layer lattice-matched to the InP:S conducting substrate, which functions as an active layer where radiation that impinges on a surface of the p-i-n photodiode is absorbed; the InGaAs layer having a thickness of about 1.5 μm, the InP:S conducting substrate being relatively thick compared to the thickness of the InGaAs layer;

an InP:Zn $p^+$ layer having a thickness which is relatively thin compared to the thickness of the InGaAs layer;

an overlayer of indium tin oxide (ITO) n⁺ material as a transparent conductor contact to provide a relatively low resistance n⁺ layer conductor in parallel with the InP:Zn p⁺ layer to reduce the effective resistance of a window layer;

a bottom contact in contact with the InP:S conducting substrate; and a bond pad in contact with the transparent ITO conductor contact layer;

whereby the p-i-n photodiode has an improved response uniformity due to the relatively thin InP:Zn p⁺ layer combined with the incorporation of a transparent n⁺ layer conductor contact.

5. The p-i-n photodiode of claim 4 wherein the InGaAs layer is an approximately 1.5 μm thick $In_{0.53}Ga_{0.47}As$ layer, the InP:Zn p⁺ layer is approximately 0.5 μm thick, and the ITO layer is approximately 1950 Angstroms thick.

6. The p-i-n photodiode of claim 4 wherein the bottom contact is an Au-Ge/Ni/Au bottom contact evaporated onto the InP:S conducting substrate and the bond pad is a plated Au bond pad.

7. The p-i-n photodiode of claim 4, further comprising Au-Zn top contacts evaporated onto the InP:Zn p⁺ layer.

8. The p-i-n photodiode of claim 4 wherein the ITO is RF sputter-deposited onto a surface of the InP:Zn p⁺ layer.

9. The p-i-n photodiode of claim 4, further comprising polyimide spun onto the p-i-n photodiode to provide passivation for a mesa and isolation for the bond pad from the InP:S conducting substrate.

10. The p-i-n photodiode of claim 5 wherein the ITO film composition is approximately, by weight, 85% indium oxide and 15% tin oxide with a film resistivity approximately equal to $2.9 \times 10^{-4}$ Ω-cm, the $In_{0.53}Ga_{0.47}As$ layer is unintentionally doped approximately $5E15$ $cm^{-3}$ n-type, and InP:Zn p⁺ layer is doped approximately $1E18$ $cm^{-3}$; and the layers are grown using atmospheric MOCVD.

11. The p-i-n photodiode of claim 9 wherein the polyimide layer is an approximately 3.0 μm thick layer of polyimide.

12. The p-i-n photodiode of claim 13 wherein the predetermined thickness of the InP layer is 0.03 to 0.5 μm.

13. A p-i-n photodiode, comprising:

an InP substrate having a first surface and a second surface;

an InGaAs layer having a first surface and a second surface, the first surface of the IngaAs layer being opposite the second surface of the InP substrate;

an InP layer having a first surface and a second surface, the first surface of the InP layer being opposite the second surface of the InGaAs layer, the InP layer having a predetermined thickness not greater than 0.5 μm;

an indium tin oxide (ITO) n⁺ material transparent window layer having a first surface and a second surface, the first surface of the ITO n⁺ material transparent window layer being opposite the second surface of the InP layer;

a bottom contact in contact with the InP substrate; and a bond pad in contact with the transparent ITO conductor contact layer.

14. The p-i-n photodiode of claim 13 wherein the ITO n⁺ window layer is RF sputter-deposited directly on the InP layer.

15. The p-i-n photodiode of claim 13 wherein the p-i-n photodiode is a grown InGaAs/InP structure, comprising:

a relatively thick InP:Zn p⁺ conducting substrate; and an $In_{0.53}Ga_{0.47}As$ unintentionally doped layer lattice-matched to the conducting substrate, which functions as an active layer where radiation that impinges on a surface of the p-i-n photodiode absorbed.

16. The p-i-n photodiode of claim 15 wherein the $In_{0.53}Ga_{0.47}As$ layer is approximately 1.8 μm thick and the ITO n⁺ window layer is approximately 0.163 μm thick.

17. The p-i-n photodiode of claim 16, further comprising an 0.5 μm thick InP:Zn p⁺ buffer layer grown between the InP:Zn p⁺ conducting substrate and the $In_{0.53}Ga_{0.47}As$ layer.

18. The p-i-n photodiode of claim 15, wherein the InP layer comprises an approximately 0.03 μm thick InP:Te n⁺ material layer grown on the $In_{0.53}Ga_{0.47}As$ layer to prevent oxidation of the InGaAs material.

19. The p-i-n photodiode of claim 15, further comprising polyimide spun onto the p-i-n photodiode to provide passivation for a mesa and isolation for the bond pad from the InP:Zn P⁺ conducting substrate.

20. The p-i-n photodiode of claim 15 wherein the InGaAs layer is an approximately 1.5 μm thick $In_{0.53}Ga_{0.47}As$ layer and wherein the InP layer comprises an approximately 0.5 μm thick unintentionally doped InP layer grown on the $In_{0.53}Ga_{0.47}As$ layer.

\* \* \* \* \*